United States Patent
Jun et al.

(10) Patent No.: US 11,257,913 B2
(45) Date of Patent: Feb. 22, 2022

(54) VERTICAL FIELD EFFECT TRANSISTOR WITH SELF-ALIGNED CONTACT STRUCTURE AND LAYOUT

(71) Applicant: SAMSUNG ELECTRONICS CO., LTD., Suwon-si (KR)

(72) Inventors: Hwi Chan Jun, Yongin-si (KR); Jung Ho Do, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/883,308

(22) Filed: May 26, 2020

(65) Prior Publication Data

US 2021/0111257 A1 Apr. 15, 2021

Related U.S. Application Data

(60) Provisional application No. 62/913,413, filed on Oct. 10, 2019.

(51) Int. Cl.
| | |
|---|---|
| *H01L 29/417* | (2006.01) |
| *H01L 27/092* | (2006.01) |
| *H01L 29/423* | (2006.01) |
| *H01L 29/78* | (2006.01) |

(52) U.S. Cl.
CPC ...... *H01L 29/41741* (2013.01); *H01L 27/092* (2013.01); *H01L 29/42356* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 9,548,385 B1 | 1/2017 | Cheng et al. | |
| 9,761,491 B1 | 9/2017 | Huang et al. | |
| 10,083,871 B2 | 9/2018 | Cheng et al. | |
| 10,128,158 B2 | 11/2018 | Anderson et al. | |
| 10,134,874 B2 | 11/2018 | Cheng et al. | |
| 10,170,473 B1 | 1/2019 | Zang et al. | |
| 10,312,154 B2 | 6/2019 | Xie et al. | |
| 10,340,364 B2 | 7/2019 | Zhang et al. | |
| 10,366,984 B2 | 7/2019 | Balakrishnan et al. | |
| 2008/0179635 A1* | 7/2008 | Gossner | H01L 29/785 257/241 |
| 2019/0198669 A1 | 6/2019 | Park et al. | |

FOREIGN PATENT DOCUMENTS

KR 10-0486253 B1 5/2005

* cited by examiner

*Primary Examiner* — Hsien Ming Lee
(74) *Attorney, Agent, or Firm* — Sughrue Mion, PLLC

(57) ABSTRACT

Provided is a structure of a vertical field effect transistor (VFET) device which includes: a fin structure protruding from a substrate, and having an H-shape in a plan view; a gate including a fin sidewall portion formed on sidewalls of the fin structure, and a field gate portion extended from the fin sidewall portion and filling a space inside a lower half of the fin structure; a gate contact landing on the field gate portion at a position inside the lower half of the fin structure; a bottom epitaxial layer comprising a bottom source/drain (S/D) region, and formed below the fin structure; a power contact landing on the bottom epitaxial layer, and configured to receive a power signal; a top S/D region formed above the fin structure; and a top S/D contact landing on the top S/D region.

19 Claims, 5 Drawing Sheets

US 11,257,913 B2

VERTICAL FIELD EFFECT TRANSISTOR WITH SELF-ALIGNED CONTACT STRUCTURE AND LAYOUT

CROSS-REFERENCE TO THE RELATED APPLICATION

This application claims priority from U.S. Provisional Application No. 62/913,413 filed on Oct. 10, 2019 in the U.S. Patent and Trademark Office, the disclosure of which is incorporated herein in its entirety by reference.

BACKGROUND

1. Field

Apparatuses and methods consistent with exemplary embodiments of the inventive concept relate to a contact or a contact structure (hereafter "contact") of a vertical field effect transistor (VFET), more particularly to, a self-aligned contact structure and layout of a bidirectional VFET.

2. Description of the Related Art

In a VFET, a current flows through a channel formed at a fin structure protruded from a substrate in a vertical direction unlike the related art planar FET or finFET. In order to provide an enhanced current path between a bottom source/drain (S/D) region and a top S/D region by increasing an effective channel width, a fin structure having an H-shape in a plan view has been introduced for the VFET, as shown in FIG. 1.

FIG. 1 illustrates a layout of a semiconductor cell architecture in which a VFET device is placed, according to a related art.

Referring to FIG. 1, a VFET device 100 including a fin structure 102 formed on a substrate 101 is placed in a semiconductor cell 10. The fin structure 102 has an H-shape in the plan view, and is encompassed by a gate 103 for the VFET device 100. Although not shown in FIG. 1 which is a plan view, the fin structure 102 is protruded from the substrate 101 in a vertical direction. The VFET device 100 also includes a top source/drain (S/D) region 104, formed above the fin structure 102, and a bottom epitaxial layer 105 including a bottom S/D region (not shown) formed below the fin structure 102. FIG. 1 shows that the top S/D region 104 overlaps the fin structure 102 in the plan view for drawing brevity, and thus, these two elements are not distinguished from each other.

The VFET device 100 further includes a top S/D contact CA landing on the top S/D region 104 at a position above a horizontal part of the H-shaped fin structure 102, a power contact CR landing on the bottom epitaxial layer 105 including the bottom S/D region, and a gate contact CB landing on the gate 103 to receive a gate input signal and deliver the same to the gate 103.

It is noted from FIG. 1, however, that while the gate 103 is divided into a fin sidewall portion 103FS, formed on the fin structure 102, and a field gate portion 103FG extended from the fin sidewall portion 103FS, the gate contact CB lands on the field gate portion 103FG at a position outside the H-shaped fin structure 102, and the power contact CR lands on the bottom epitaxial layer 105 at a position outside the H-shaped fin structure 102. That is, both the gate contact CB and the power contact CR are disposed outside the H-shaped fin structure 102. Thus, there is an area penalty in the semiconductor cell 10 including the VFET device 100 as shown in FIG. 1 because the semiconductor cell 10 has to provide a space for the gate contact CB and a space for the power contact CR outside an area of the H-shaped fin structure 102 in the plan view.

Therefore, there is a demand for further reducing the size of a related-art VFET device and a semiconductor cell including the VFET device by disposing a gate contact and a power contact in different areas.

SUMMARY

Various embodiments of the inventive concept provide structures of a vertical field effect transistor (VFET) which provides an area gain by disposing a gate contact and/or a power contact inside of a fin structure having a plurality line-shaped parts connected to one another, such as an H-shaped fin structure, in a plan view.

According to exemplary embodiments, there is provided a VFET device which may include: a fin structure protruding from a substrate, and having an H-shape in a plan view; a gate including a fin sidewall portion formed on sidewalls of the fin structure, and a field gate portion extended from the fin sidewall portion and filling a space inside a lower half of the fin structure; a gate contact landing on the field gate portion at a position inside the lower half of the fin structure; a bottom epitaxial layer including a bottom source/drain (S/D) region, and formed below the fin structure; a power contact landing on the bottom epitaxial layer, and configured to receive a power signal; a top S/D region formed above the fin structure; and a top S/D contact landing on the top S/D region.

According to exemplary embodiments, there is provided a VFET device which may include: a fin structure protruding from a substrate, and having a plurality of line-shaped parts connected to one another in a plan view; a gate including a fin sidewall portion formed on sidewalls of the fin structure, and a field gate portion connected to the fin sidewall portion, and filling a space between two or more of the line-shaped parts; a gate contact landing on the gate; a bottom epitaxial layer including a bottom S/D region, and formed below the fin structure; a power contact landing on the bottom epitaxial layer, and configured to receive a power signal; a top S/D region formed above the fin structure; and a top S/D contact landing on the top S/D region, wherein at least one of the gate contact and the power contact is disposed within a virtual two-dimensional shape formed by connecting outer end portions of the line-shaped parts of the fin structure.

According to exemplary embodiments, there is provided a semiconductor cell structure which may include a first VFET device and a second VFET device arranged in a cell height direction. The first VFET device may include: a first fin structure protruding from a substrate and having an H shape in a plan view; a first gate including a first fin sidewall portion formed on sidewalls of a lower half of the first fin structure, and a first field gate portion extended from the first fin sidewall portion and filling in the lower half of the first fin structure; a first bottom epitaxial layer comprising a bottom source/drain (S/D) region, and formed below the first fin structure; a first power contact landing on the first bottom epitaxial layer; a first top S/D region formed above the first fin structure; and a first top S/D contact landing on the first top S/D region. The second VFET device may include: a second fin structure protruding from the substrate and having an H shape in the plan view; a second gate including a second fin sidewall portion formed on sidewalls of an upper half of the second fin structure, and a second field gate portion extended from the second fin sidewall portion and filling in the upper half of the second fin structure; a second bottom epitaxial layer comprising a bottom source/drain (S/D) region, and formed below the second fin structure; a second power contact landing on the second bottom epitaxial layer; a second top S/D region formed above the second fin structure; and a second top S/D contact landing on the second top S/D region. Here, the first field gate portion and the second field gate portion are merged to form a merged field gate portion, wherein the first VFET device and the second VFET device share a gate contact landing on the merged field gate portion, and wherein at least one of the first power contact and the second power contact lands on at least one of the first bottom epitaxial layer and the second bottom epitaxial layer at a position inside at least one of the upper half of the first fin structure and the lower half of the second fin structure, respectively.

BRIEF DESCRIPTION OF THE DRAWINGS

The above and other aspects of inventive concepts will become more apparent to those of ordinary skill in the art by describing in detail example embodiments thereof with reference to the accompanying drawings, in which.

DETAILED DESCRIPTION

Figure 1:
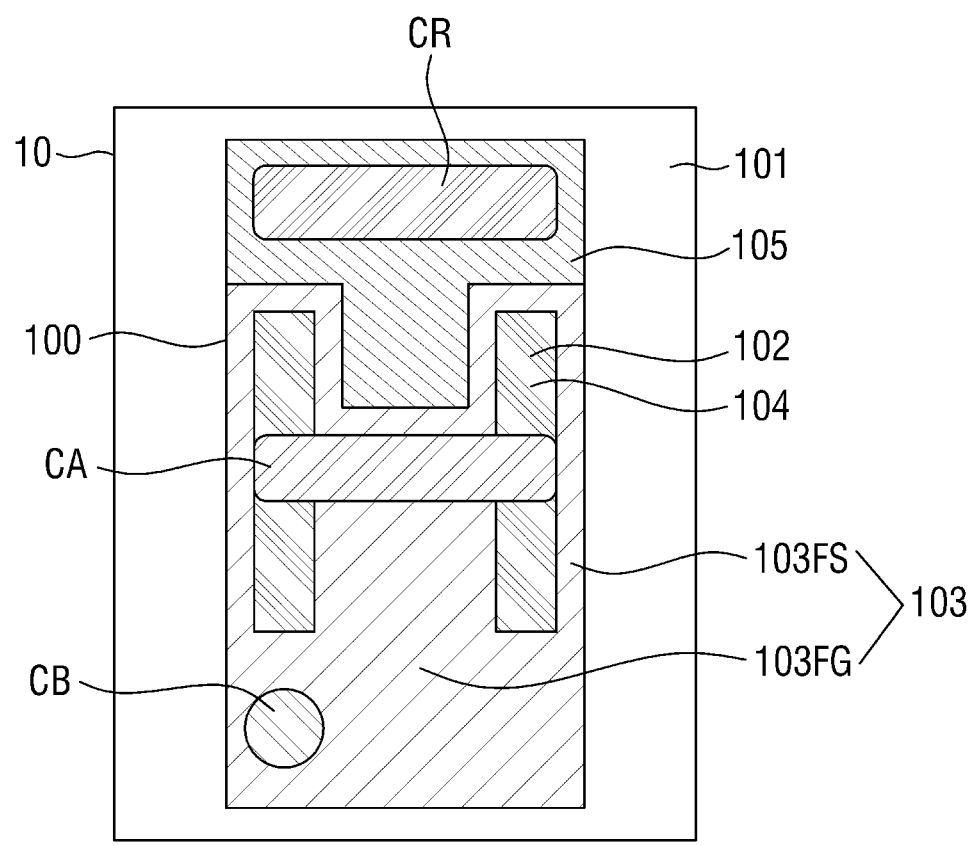
FIG. 1 illustrates a layout of a semiconductor cell architecture in which a VFET device is placed, according to a related art.

Various embodiments of the inventive concept will be described more fully hereinafter with reference to the accompanying drawings. These embodiments are all exemplary, and may be embodied in many different forms and should not be construed as limiting the inventive concept. Rather, these embodiments are merely provided so that this disclosure will be thorough and complete, and will fully convey the inventive concept to those skilled in the art. In the drawings, the sizes and relative sizes of the various layers and regions may have been exaggerated for clarity, and thus, the drawings are not necessarily to scale, some features may be exaggerated to show details of particular components or elements. Therefore, specific structural and functional details disclosed herein are not to be interpreted as limiting, but merely as a representative basis for teaching one skilled in the art to variously employ the methods and structures of the embodiments.

An embodiment provided herein is not excluded from being associated with one or more features of another example or another embodiment also provided herein or not provided herein but consistent with the inventive concept. For example, even if matters described in a specific embodiment are not described in a different embodiment, the matters may be understood as being related to or combined with the different embodiment, unless otherwise mentioned in descriptions thereof.

For the purposes of the description hereinafter, the terms "upper", "lower", "top", "bottom", "left," and "right," and derivatives thereof can relate, based on context, to the disclosed structures, as they are oriented in the drawings. The same numbers in different drawings may refer to the same structural component or element thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. Expressions such as "at least one of," when preceding a list of elements, modify the entire list of elements and do not modify the individual elements of the list.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
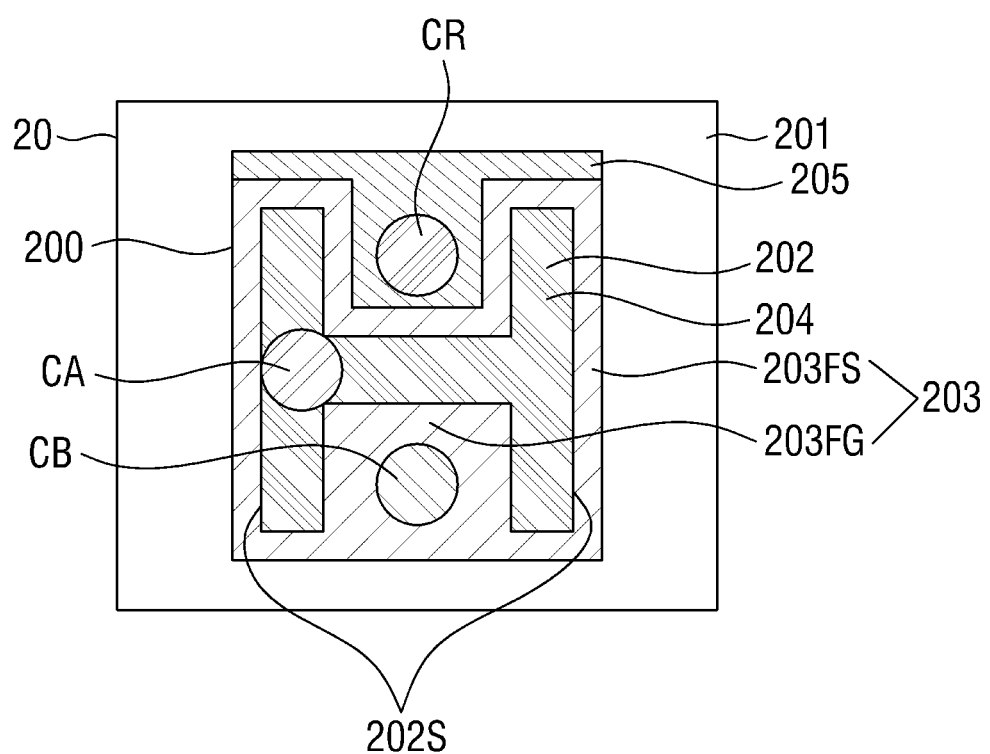
FIG. 2 illustrates a layout of a semiconductor cell architecture in which a VFET device is placed, according to an embodiment.

FIG. 2 illustrates a layout of a semiconductor cell architecture in which a VFET device is placed, according to an embodiment.

Referring to FIG. 2, a VFET device 200 including a fin structure 202 formed on a substrate 201 is placed in a semiconductor cell 20. The fin structure 202 may be patterned on the substrate 201, which is a wafer, formed of silicon (Si), germanium (Ge) or its combination, not being limited thereto.

Although not shown in FIG. 2 which is a plan view, the fin structure 202 is protruded from the substrate 201 in a vertical direction. Like the fin structure 102 of the VFET device 100 shown in FIG. 1, the fin structure 202 of the VFET device 200 having an H-shape in the plan view is wrapped by a gate 203 for the VFET device 200. The gate 203 may include a plurality layers including a dielectric layer and a conductor layer (not shown) formed of a metal or metal compound.

Also, like the VFET device 100 of FIG. 1, the VFET device 200 includes a top S/D region 204 formed above the fin structure 202, and a bottom epitaxial layer 205 including a bottom S/D region (not shown) formed below the fin structure 202. The top S/D region 204 and the bottom S/D region may be formed by of doping a corresponding epitaxial layer formed of Si, Ge, SiGe, etc., not being limited thereto. For example, the bottom S/D region may be formed by doping the bottom epitaxial layer 205 with one or more dopants such as boron (B) for a p-channel VFET and phosphorous (P) for n-channel VFET, not being limited thereto.

FIG. 2 further shows that the top S/D region 204 overlaps the fin structure 202 in the plan view, for drawing brevity, and thus, these two elements are not distinguished from each other. However, an area of the fin structure 202 is not necessarily the same as an area of the top S/D region 204 in the plan view. Thus, the area of the top S/D region 204 may be greater or small than the area of the fin structure 202 in the plan view for design purposes.

The VFET device 200 also includes a top S/D contact CA landing on the top S/D region 204, a power contact CR landing on the bottom epitaxial layer 205 including the bottom S/D region, and a gate contact CB landing on the gate 203 to receive a gate input signal and deliver the same to the gate 203. These contacts CA, CR and CB may be formed of one or more metals such as Tungsten or metal compounds, not being limited thereto.

FIG. 2 shows that the gate 203 is divided into a fin sidewall portion 203FS formed on sidewalls 202S of the fin structure 202, and a field gate portion 203FG extended from the fin sidewall portion 203FS to fill in at least a space inside the lower half of the H-shaped fin structure 202 where the fin sidewall portion 203FS is not formed.

The fin sidewall portion 203FS of the gate 203 may be formed on all sidewalls 202S of the fin structure 202. On the field gate portion 203FG, does the gate contact CB land to receive a gate input signal. With this structure in which the gate contact CB lands on the field gate portion 203FG at a position inside the lower half of the H-shaped fin structure 202, it may be possible to provide an area gain to the VFET device 200 as well as the semiconductor cell 20 including the VFET device 200.

In addition, the power contact CR lands on the bottom epitaxial layer 205 at a position inside an upper half of the H-shaped fin structure 202, thereby to provide an additional area gain to the VFET device 200 as well as the semiconductor cell 20 including the VFET device 200. Here, no portion of the gate 203 is formed at a position where the power contact CR lands in the semiconductor cell 20.

According to FIG. 2, a position where the top S/D contact CA lands is limited to a portion of the top S/D region 204 overlapping one portion of the H-shaped fin structure 202 where a horizontal part thereof meets one vertical part thereof.

According to an embodiment, the field gate portion 203FG of the gate 203 may be formed by gate pattern masking, while the fin sidewall portion 203FS of the gate 203 may be formed by a self-aligning method from top. Further, according to an embodiment, the power contact CR and the gate contact CB may be formed by a self-aligning method from top, respectively, inside the upper half and the lower half of the H-shaped fin structure 202.

Figure 3:
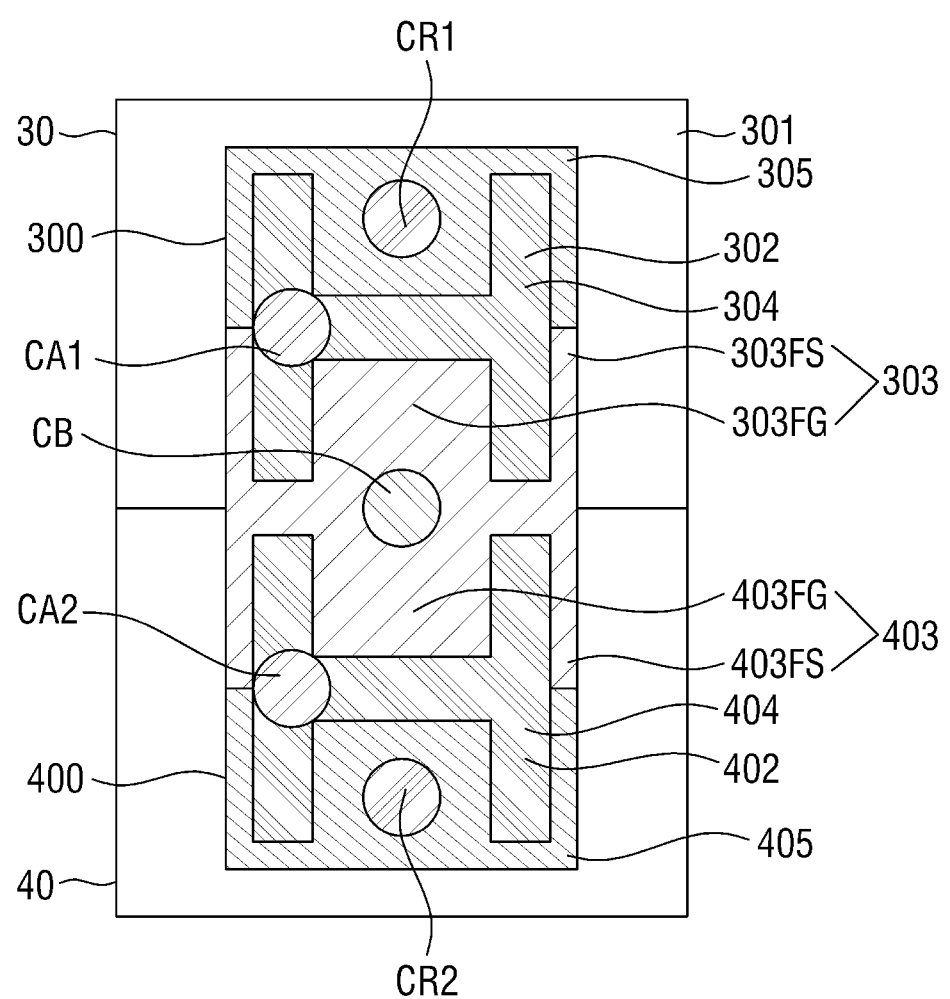
FIG. 3 illustrates a layout of a semiconductor cell architecture in which two VFET devices are placed, according to an embodiment.

FIG. 3 illustrates a layout of a semiconductor cell architecture in which two VFET devices are placed, according to an embodiment. The materials forming various elements of the two VFET devices described below may be the same or substantially similar to those for the VFET device 200 of FIG. 2, and thus, the descriptions thereabout are omitted herein.

Figure 4:
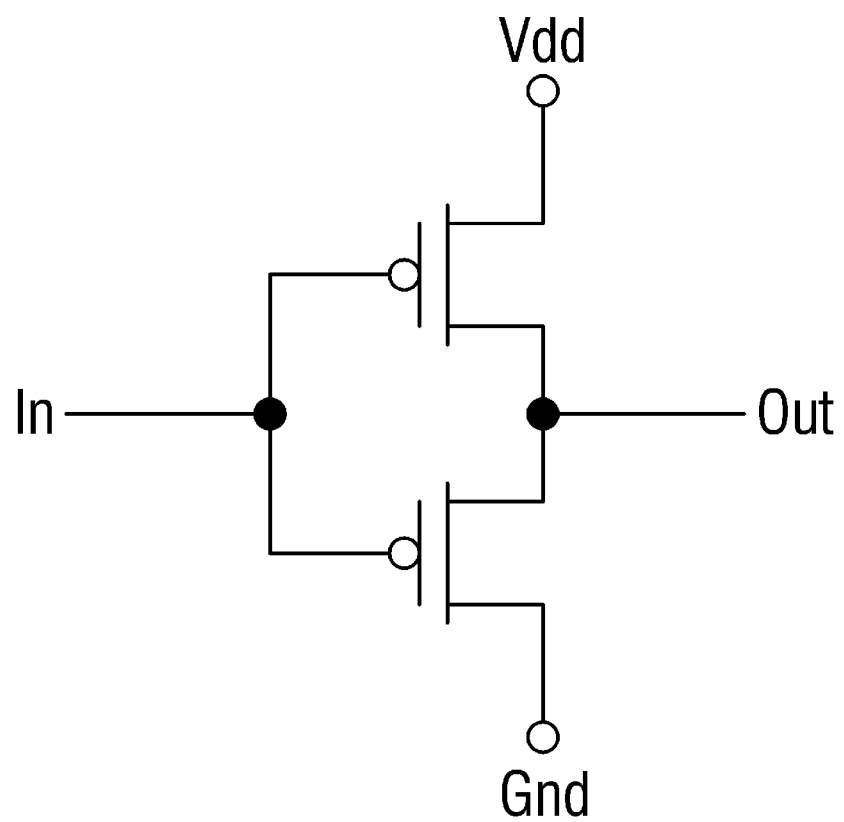
FIG. 4 illustrates a schematic of an inverter formed by a PMOS VFET device and an NMOS VFET device, according to an embodiment.

Referring to FIG. 3, a semiconductor cell structure includes an upper cell 30, in which a p-channel metal-oxide semiconductor (PMOS) VFET device 300 is placed, and a lower cell 40 in which an n-channel metal-oxide semiconductor (NMOS) VFET device 400 is placed. The PMOS VFET device 300 and the NMOS VFET device 400 formed on a same substrate 301 are arranged in a cell height direction to constitute an inverter of which a schematic is shown in FIG. 4.

The PMOS VFET device 300 includes a fin structure 302 formed on the substrate 301 and having an H-shape in the plan view. Although not shown in FIG. 3 which is a plan view, the fin structure 302 is protruded from the substrate 301 in a vertical direction like the fin structure 202 of the VFET device 200 in the previous embodiment.

Also, like the VFET device 200 of FIG. 2, the PMOS VFET device 300 includes a top S/D region 304 formed above the fin structure 302, and a bottom epitaxial layer 305 including a bottom S/D region (not shown) formed below the fin structure 302. Further, FIG. 3 shows that the top S/D region 304 overlaps the fin structure 302 in the plan view for drawing brevity, and thus, these two elements are not distinguished from each other. However, an area of the fin structure 302 is not necessarily the same as an area of the top S/D region 304 in the plan view. Thus, the area of the top S/D region may be greater or small than the area of the fin structure 302 in the plan view for design purposes.

The PMOS VFET device 300 also includes a top S/D contact CA1 landing on the top S/D region 304, and a power contact CR1 landing on the bottom epitaxial layer 305 including the bottom S/D region. The power contact CR1 is disposed inside an upper half of the H-shaped fin structure 302 in the plan view, thereby to provide an area gain to the PMOS VFET device 300 as well as the upper cell 30 including the PMOS VFET device 300.

However, the PMOS VFET device 300 has a gate 303 having a structure different from that of the VFET device 200 of FIG. 2. First, while the gate 303 is divided into a fin sidewall portions 303FS and a field gate portion 303FG like the gate 203 of the VFET device of FIG. 2, the fin sidewall portion 303FS is formed on only a lower half of the fin structure 302. Next, the field gate portion 303FG is extended from the fin sidewall portion 303FS to fill in at least a space inside the lower half of the H-shaped fin structure 302. Further, this field gate portion 303FG is connected or merged with a field gate portion 403FG of a gate 403 of the NMOS VFET device so that a common gate contact CB landing on the field gate portion 303FG can be shared by the PMOS VFET device 300 and the NMOS VFET device 400. This gate structure may be viewed as gate sharing by the PMOS VFET device 300 and the NMOS VFET device 400.

The NMOS VFET device 400 has the same structure as the PMOS VFET device 300 except that the NMOS VFET device 400 is placed in the lower cell 40 in a symmetrical manner with respect to a border line between the upper cell 30 and the lower cell 40. Thus, a power contact CR2 of the NMOS VFET device 400 is disposed inside a lower half of an H-shaped fin structure 402 in the plan view, thereby also to provide an area gain to the NMOS VFET device 400 as well as the lower cell 40 including the NMOS VFET device 400. However, a top S/D region 404, a bottom epitaxial layer 405 including a bottom S/D region (not shown), and a top S/D contact CA2 landing on the top S/D region 404 of the NMOS VFET device 400 have the same structures as the corresponding elements of the PMOS VFET device 300.

The gate 403 of the NMOS VFET device 400 is also divided into a fin sidewall portion 403FS and the field gate portion 403FG. Symmetrically with respect to the PMOS VFET device 300, the fin sidewall portion 403FS is formed on only an upper half of the fin structure 402, and the field gate portion 403FG is extended from the fin sidewall portion 403FS to fill in at least a space inside the upper half of the H-shaped fin structure 402. Further, as discussed above, the field gate portion 403FG is connected or merged with the field gate portion 303FG of the gate 303 of the PMOS VFET device 300, and the NMOS VFET device 400 and the PMOS VFET device 300 may have only one gate contact, that is, the common gate contact CB, to input a gate input signal to both the gate 303 and the gate 403 according to the inverter schematic shown in FIG. 4. By this gate structure, additional area gain can be provided to the inverter formed of the PMOS VFET device 300 and the NMOS VFET device 400 as well as the upper cell 30 and the lower cell 40.

According to the present embodiment, the common gate contact CB lands on the merged field gate portion 303FG and field gate portion 403FG at a position between the lower half of the H-shaped fin structure 302 and the upper half of the H-shaped fin structure 402. However, the inventive concept is not limited thereto. Taking advantage of the area gain discussed above, the semiconductor cell structure shown in FIG. 3 may be modified by increasing the vertical lengths of at least one of the H-shaped fin structure 302 and the H-shaped fin structure 402, in which case the position of the common gate contact CB may be placed inside the lower half of the H-shaped fin structure 302, or the upper half of the H-shaped fin structure 402, or overlap the border line between the upper cell 30 and the lower cell 40, as shown in FIG. 5.

Figure 5:
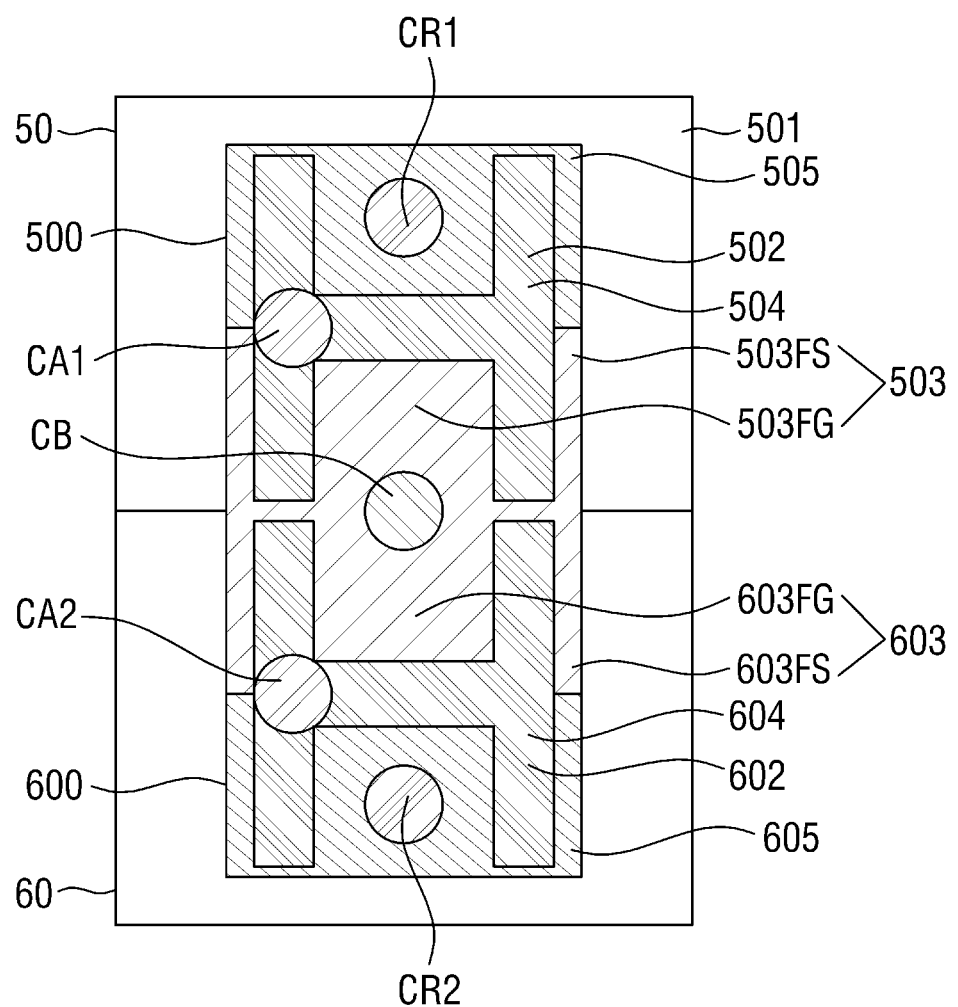
FIG. 5 illustrates a layout of a semiconductor cell architecture in which two VFET devices are placed, according to another embodiment.

FIG. 5 illustrates a layout of a semiconductor cell architecture in which two VFET devices are placed, according to another embodiment.

Referring to FIG. 5, a semiconductor cell structure shown therein is the same as that shown in FIG. 3 to constitute the inverter shown in FIG. 4 except that two H-shaped fin structures 502 and 602 placed in upper and lower cells 50 and 60 have longer vertical parts compared to the H-shaped fin structure 302 and 402 in FIG. 3. Thus, a common gate contact CB lands on a merged field gate portion 503FG and field gate portion 603FG at a position between a lower half of the H-shaped fin structure 502 and an upper half of the H-shaped fin structure 602. The other elements of the semiconductor cell structure shown in FIG. 5 is the same as those shown in FIG. 3, and thus, the structures of a substrate 501, gates 503 and 603, fin sidewall portions 503FS and 603FS, bottom epitaxial layers 505 and 605 including respective bottom S/D regions, and top S/D regions 504 and 604 of a PMOS VFET device 500 and an NMOS VFET device 600 may be the same or substantially similar to the corresponding ones shown in FIG. 3.

It is noted that the semiconductor cell structure having the elongated H-shaped fin structure as shown in FIG. 5 may be considered to further improve the performance characteristics of a VFET device included in the semiconductor cell structure, while the semiconductor cell structure having the non-elongated H-shaped fin structure as shown in FIG. 3 may be considered for implementing a high-density VFET device.

Thus, according to an embodiment, the semiconductor cell structure shown in FIG. 3 and the semiconductor cell structure shown in FIG. 5 may be formed on a same wafer in order to achieve both a high-density VFET device(s) and a high-performance VFET device(s).

In the above embodiments, additional elements to constitute each of the VFET devices have been omitted for brevity of descriptions. For example, a bottom spacer and a top spacer separating each of the gate from the bottom S/D region and the top S/D region, respectively, are not described for brevity purposes.

According to the above embodiments, the gate contact CB and the power contact CR, CR1 or CR2 are positioned at spaces inside the H-shaped fin structure in FIG. 2, and at a border of the upper cell 30 and the lower cell 40 in FIGS. 3 and 5. However, the inventive concept is not limited thereto. According to an embodiment, the gate contact CB, the power contacts CR, CR1 and/or CR2 positioned at the above-mentioned spaces may also overlap a portion of the corresponding fin structure.

According to the above embodiments of FIGS. 2, 3 and 5, the inventive concept is described according to fin structures having the H-shape are discussed. However, the inventive concept is applied to not only the H-shape but also fin structures having a plurality line-shaped (or bar-shaped) parts connected to one another (hereafter referred to as "line-shaped parts"), such as characters E, X, and a symbol +, according to embodiments. Thus, when a VFET device has a fin structure having the line-shaped parts, a gate contact and/or a power contact may be disposed inside a virtual two-dimensional shape formed by connecting outer end portions of the line-shaped parts of the fin structure to provide area gains to the VFET device and a cell in which the VFET is placed.

The foregoing is illustrative of exemplary embodiments and is not to be construed as limiting thereof. Although a few exemplary embodiments have been described, those skilled in the art will readily appreciate that many modifications are possible in the above embodiments without materially departing from the inventive concept.

What is claimed is:

1. A vertical field effect transistor (VFET) device comprising:
    a fin structure protruding from a substrate, and having an H-shape in a plan view;
    a gate comprising:
        a fin sidewall portion formed on sidewalls of the fin structure; and
        a field gate portion extended from the fin sidewall portion, and filling a space inside a lower half of the fin structure;
    a gate contact landing on the field gate portion at a position inside the lower half of the fin structure;
    a bottom epitaxial layer comprising a bottom source/drain (S/D) region, and formed below the fin structure;
    a power contact landing on the bottom epitaxial layer, and configured to receive a power signal;
    a top S/D region formed above the fin structure; and
    a top S/D contact landing on the top S/D region.

2. The VFET device of claim 1, wherein the power contact lands on the bottom epitaxial layer at a position inside an upper half of the fin structure.

3. The VFET device of claim 2, wherein the fin sidewall portion of the gate is formed by self-aligning, and the field gate portion of the gate is formed by gate pattern masking, and
    wherein the gate contact and the power contact are formed by self-aligning.

4. The VFET device of claim 2, wherein the field gate portion of the gate is not formed inside the upper half of the fin structure.

5. The VFET device of claim 2, wherein the top S/D contact lands on the top S/D region at a position overlapping a portion of the fin structure where one vertical part is connected to a horizontal part.

6. The VFET device of claim 2, wherein at least one of the gate contact and the power contact overlaps a portion of the fin structure.

7. The VFET device of claim 1, wherein the fin sidewall portion of the gate is formed all of the sidewalls of the fin structure.

8. The VFET device of claim 1, wherein the bottom epitaxial layer encompasses the fin structure in the plan view.

9. A vertical field effect transistor (VFET) device comprising:
   a fin structure protruding from a substrate, and having a plurality of line-shaped parts connected to one another in a plan view;
   a gate comprising:
      a fin sidewall portion formed on sidewalls of the fin structure; and
      a field gate portion connected to the fin sidewall portion, and filling a space between two or more of the line-shaped parts;
   a gate contact landing on the gate;
   a bottom epitaxial layer comprising a bottom source/drain (S/D) region, and formed below the fin structure;
   a power contact landing on the bottom epitaxial layer, and configured to receive a power signal;
   a top S/D region formed above the fin structure; and
   a top S/D contact landing on the top S/D region,
   wherein at least one of the gate contact and the power contact is disposed within a virtual two-dimensional shape formed by connecting outer end portions of the line-shaped parts of the fin structure.

10. The VFET device of claim 9, wherein the gate contact lands on the field gate portion at a position between the two or more of the line-shaped parts.

11. The VFET device of claim 10, wherein the power contact lands on the bottom epitaxial layer at a position within two or more of the line-shaped parts where the field gate portion is not formed.

12. The VFET device of claim 9, wherein the field gate portion is not formed outside the virtual two-dimensional shape.

13. A semiconductor cell structure comprising a first vertical field effect transistor (VFET) device and a second VFET device arranged in a cell height direction,
   wherein the first VFET device comprises:
      a first fin structure protruding from a substrate and having an H shape in a plan view;
      a first gate comprising a first fin sidewall portion formed on sidewalls of a lower half of the first fin structure, and a first field gate portion extended from the first fin sidewall portion and filling in the lower half of the first fin structure;
      a first bottom epitaxial layer comprising a bottom source/drain (S/D) region, and formed below the first fin structure;
      a first power contact landing on the first bottom epitaxial layer;
      a first top S/D region formed above the first fin structure; and
      a first top S/D contact landing on the first top S/D region,
   wherein the second VFET device comprises:
      a second fin structure protruding from the substrate and having an H shape in the plan view;
      a second gate comprising a second fin sidewall portion formed on sidewalls of an upper half of the second fin structure, and a second field gate portion extended from the second fin sidewall portion and filling in the upper half of the second fin structure;
      a second bottom epitaxial layer comprising a bottom source/drain (S/D) region, and formed below the second fin structure;
      a second power contact landing on the second bottom epitaxial layer;
      a second top S/D region formed above the second fin structure; and
      a second top S/D contact landing on the second top S/D region
   wherein the first field gate portion and the second field gate portion are merged to form a merged field gate portion,
   wherein the first VFET device and the second VFET device share a gate contact landing on the merged field gate portion, and
   wherein at least one of the first power contact and the second power contact lands on at least one of the first bottom epitaxial layer and the second bottom epitaxial layer at a position inside at least one of the upper half of the first fin structure and the lower half of the second fin structure, respectively.

14. The semiconductor cell structure of claim 13, wherein the gate contact lands on the merged field gate portion at a position outside both the first fin structure and the second fin structure.

15. The semiconductor cell structure of claim 14, wherein the first power contact lands on the first bottom epitaxial layer at a position inside the upper half of the first fin structure, and the second power contact lands on the second bottom epitaxial layer at a position inside the lower half of the second fin structure.

16. The semiconductor cell structure of claim 13, wherein the gate contact lands on the merged field gate portion at a position inside one of the lower half of the first fin structure and the upper half of the second fin structure.

17. The semiconductor cell structure of claim 13, wherein the first power contact is configured to receive a power signal, and the second power contact is configured to receive a ground signal, and
   wherein the first VFET device and the second VFET device are connected to constitute an inverter.

18. The semiconductor cell structure of claim 13, further comprising a third VFET device and a fourth VFET device arranged in a cell height direction,
   wherein the third VFET device has the same structure of the first VFET device, and the fourth VFET device has the same structure of the second VFET device, except that each of a length of a vertical part of a third fin structure of the third VFET device corresponding to the first fin structure and a length of a vertical part of a fourth fin structure of the fourth VFET device corresponding to the second fin structure is greater than a length of a vertical part of the first fin structure or a vertical part of the second fin structure.

19. The semiconductor cell structure of claim 13, further comprising a third VFET device and a fourth VFET device arranged in a cell height direction,
   wherein the third VFET device has the same structure of the first VFET device, and the fourth VFET device has the same structure of the second VFET device, except that a length of a vertical part of a third fin structure of the third VFET device corresponding to the first fin structure and a length of a vertical part of a fourth fin structure of the fourth VFET device corresponding to the second fin structure are greater than a length of a vertical part of the first fin structure and a vertical part of the second fin structure, respectively.

* * * * *